United States Patent
Zenou

(10) Patent No.: US 11,779,955 B1
(45) Date of Patent: Oct. 10, 2023

(54) METHODS FOR RESIDUAL MATERIAL COLLECTION IN LASER-ASSISTED DEPOSITION

(71) Applicant: Reophotonics, Ltd., Modiin (IL)

(72) Inventor: Michael Zenou, Hashmonaim (IL)

(73) Assignee: Reophotonics, Ltd., Modiin (IL)

( * ) Notice: Subject to any disclaimer, the term of this patent is extended or adjusted under 35 U.S.C. 154(b) by 0 days.

(21) Appl. No.: 18/168,057

(22) Filed: Feb. 13, 2023

Related U.S. Application Data

(60) Provisional application No. 63/268,969, filed on Mar. 7, 2022, provisional application No. 63/268,867, filed on Mar. 4, 2022.

(51) Int. Cl.
| | | |
|---|---|---|
| *B05D 1/28* | (2006.01) | |
| *B05D 3/06* | (2006.01) | |
| *B05C 5/02* | (2006.01) | |
| *B05C 9/14* | (2006.01) | |
| *B05C 11/10* | (2006.01) | |
| *B05D 3/12* | (2006.01) | |
| *B05D 1/40* | (2006.01) | |

(52) U.S. Cl.
CPC ............ *B05D 1/286* (2013.01); *B05C 5/0245* (2013.01); *B05C 9/14* (2013.01); *B05C 11/1039* (2013.01); *B05D 1/40* (2013.01); *B05D 3/06* (2013.01); *B05D 3/12* (2013.01)

(58) Field of Classification Search
None
See application file for complete search history.

(56) References Cited

U.S. PATENT DOCUMENTS

| | | | |
|---|---|---|---|
| 9,925,797 B2 | 3/2018 | Kotler et al. | |
| 10,603,684 B2 | 3/2020 | Zenou et al. | |
| 11,420,397 B2 | 8/2022 | Zenou et al. | |
| 2008/0151034 A1 | 6/2008 | Mohri et al. | |
| 2008/0166495 A1* | 7/2008 | Maeno ............... | B41J 11/00212 427/493 |
| 2018/0015671 A1* | 1/2018 | Sandstrom ............. | C23C 14/56 |

(Continued)

FOREIGN PATENT DOCUMENTS

JP    S63-267524 A    11/1988

OTHER PUBLICATIONS

International Search Report and Written Opinion dated May 15, 2023, from the ISA/European Patent Office, for International Patent Application No. PCT/IB2023/051971 (filed Mar. 2, 2023), 10 pgs.

*Primary Examiner* — James M Mellott
(74) *Attorney, Agent, or Firm* — ASCENDA LAW GROUP, PC

(57) ABSTRACT

In a laser-assisted deposition system, a uniform layer of material is coated onto a donor substrate at a coating system, and portions of the material are jetted from the donor substrate to a receiving substrate at a printing unit, leaving residual portions of the material on the donor substrate. In order to not waste the residual portions of the material, the donor substrate with the residual portions of the material is returned to the coating system where the residual portions of the material are aggregated into a blob and subsequently recoated onto the donor substrate. The blob may be formed by translating the residual portions of the material towards an interface formed by two coating rollers, a squeegee and the donor substrate, or a film and the donor substrate.

5 Claims, 16 Drawing Sheets

(56) References Cited

U.S. PATENT DOCUMENTS

| | | |
|---|---|---|
| 2019/0322052 A1 | 10/2019 | Houben et al. |
| 2021/0252782 A1* | 8/2021 | Kobashigawa ......... B22F 12/50 |
| 2022/0040912 A1 | 2/2022 | Zenou et al. |
| 2022/0088854 A1 | 3/2022 | Zenou et al. |

* cited by examiner

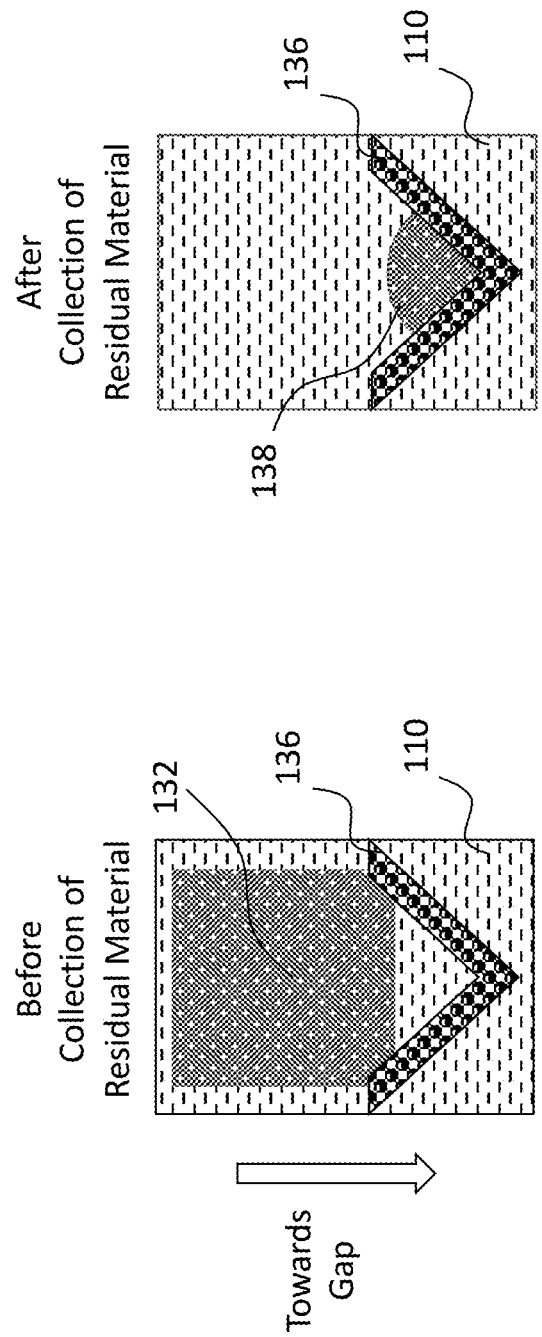

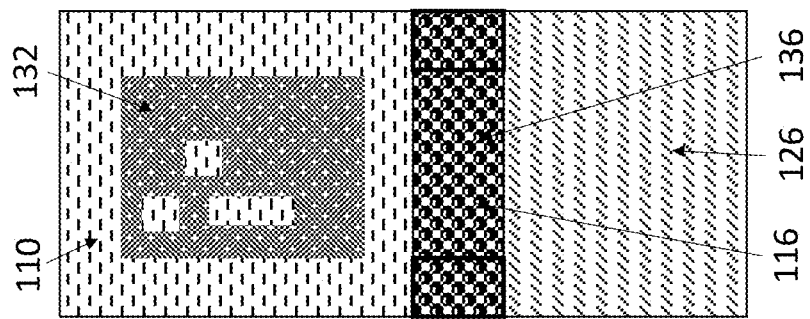
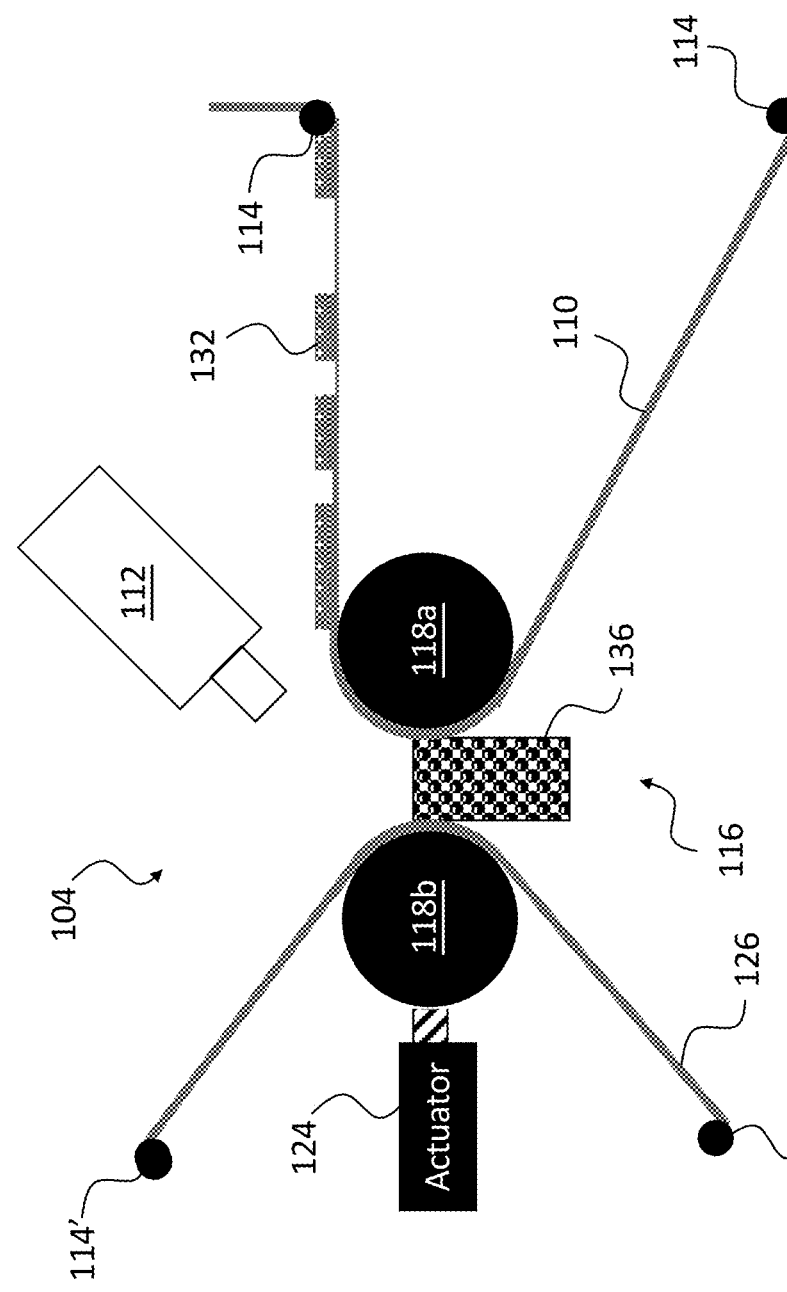
FIG. 15B (Top view)
FIG. 15A (Side view)

METHODS FOR RESIDUAL MATERIAL COLLECTION IN LASER-ASSISTED DEPOSITION

RELATED APPLICATIONS

This application is a nonprovisional of, claims priority to, and incorporates by reference U.S. Provisional Application No. 63/268,969, filed on 7 Mar. 2022 and U.S. Provisional Application No. 63/268,867, filed on 4 Mar. 2022.

FIELD OF THE INVENTION

The present invention relates to systems and methods for collecting residual material that remains on a donor substrate after laser-assisted deposition of the material from the donor substrate to a receiving substrate, allowing for immediate reuse of the collected residual material.

BACKGROUND

In a laser-assisted deposition system, a uniform layer of material is coated onto a donor substrate at a coating system, and portions of the material are jetted from the donor substrate to a receiving substrate at a printing unit, leaving residual portions of the material on the donor substrate.

SUMMARY OF THE INVENTION

The present inventor has recognized that in a system configured to print a solder paste material, or any other viscous material, using laser-assisted deposition in which the material is first coated on and then printed from a donor substrate, there are advantages afforded by collecting (or aggregating) residual portions of the material in such a fashion that the residual material can be immediately used for subsequent printing processes. To that end, in various embodiments, the present invention provides a printing system that coats the to-be-printed material on a donor substrate and thereafter prints the material to a receiving substrate via laser-assisted deposition. Following such printing, residual portions of the material that remain on the donor substrate are collected (or aggregated) in or near the area in which the initial coating of material was performed. Importantly, this collection (or aggregation) of the residual material is done so that the residual material remains on (or near) the donor substrate, allowing it to be immediately reused following its collection (or aggregation). If needed, the residual portions of the material can be supplemented by additional amounts of material before the printing is performed. The printing system may include one or more imaging arrangements for monitoring the progress and/or assisting in the control of the various processes.

In some embodiments of the invention, the printing system includes a coating system that creates a uniform layer of the printed material on the donor substrate. The term "donor substrate" should be recognized as meaning any suitable film or substrate on which the material to be printed may be coated for purposes of transport to the laser-based printing portion of the printing system. Where present, the coating system may include a syringe of the to-be-printed material and an air or mechanical pump that drives the material onto the donor substrate. The donor substrate is then moved towards and through a well-defined gap (e.g., between rollers or knives) to create a uniform layer of the printed material with a thickness that is defined by the gap. In some cases, the coating system may contain more than one material, thereby creating a possibility for printing a plurality materials onto the donor substrate in a controlled sequence and making it possible to print more than one material on the receiving substrate. Within the coating system, the donor substrate is translatable in a bidirectional fashion and in a controlled manner (e.g., while opening a gap between coating rollers), thereby allowing for collection of residual material from the donor substrate after a printing operation without contamination of the rollers and loss of the residual material.

In various embodiments of the invention, the printed material may be a solder paste or other metal paste(s) used for printed electronics, a metal paste or a ceramic paste, a highly viscous material, a wax material, a polymer material, a mixture of a polymer and a monomer material, a low viscosity material, a material that can be cured by ultraviolet (UV) or visible light or by heating, or a material that can be dried. The printing process may use a laser-based system that contains a laser (e.g., a high frequency laser) to enable jetting of the material from the donor substrate to the receiving substrate.

In some cases, collection (or aggregation) of the residual material is performed using a blade or a squeegee. By translating the donor substrate under the blade or squeegee, the residual material is collected (or aggregated) so that it remains on the donor substrate. The collection (or aggregation) is preferably performed in the vicinity of the coating system, for example, immediately upstream (as measured from the direction of travel of the donor substrate from the coating system to the printing unit) of the coating system so that the collected residual material and any supplemental material from the coating system may be immediately moved towards and through the well-defined gap, resulting in the donor substrate that has been recoated with a uniform layer of the to-be-printed material of a desired thickness that is ready for a subsequent printing operation.

In some embodiments of the invention, the coating system includes a gap control unit configured to maintain the dimensions of the well-defined gap. For example, the well-defined gap may be maintained by rollers, one or more of which is positionable with respect to the other or one another using actuators. The actuators may be piezoelectric actuators capable of small displacements in one or more dimensions, allowing for fine control of the gap width.

As noted above, the donor substrate may be any suitable film or substrate on which the material to be printed may be coated and, in some embodiments of the invention, may be a continuous or other transparent film substrate, a transparent film substrate coated by a metal layer or by a metal and a dielectric layer, or a transparent solid substrate. For example, the donor substrate may be a film substrate that, by rolling (under the influence of one or more motors or by being turned on a reel), can deliver the to-be-printed material from the coating system to the printing unit.

In accordance with various embodiments of the invention, a system that employs a narrow or contact gap printing system to effect printing of viscous materials, such as solder paste, performs an initial coating of the viscous material on a donor substrate. As part of this procedure, the donor substrate may be observed by one or more imaging arrangements for monitoring and control of the coating and subsequent printing and residual material recovery processes. The coated donor substrate is employed in printing of the viscous material to a receiving substrate. This printing procedure may involve the viscous material being distributed on the receiving substrate as dots (e.g., small, generally round spots or droplets) or other segments through a laser-assisted deposition or other laser dispensing printing operation, where the dots or other segments of the viscous material are ejected from a uniform layer thereof on the coated donor substrate onto the receiving substrate using a laser (e.g., a high frequency laser). Residual, un jetted portions of the viscous material remaining on the donor substrate after the laser-assisted deposition or other laser dispensing printing operation are then recovered, preferably by returning the portion of the donor substrate with the residual material thereon to an area near (or within) the coating system and so that it remains on the donor substrate so that it is available for immediate reuse (optionally along with additional amounts of the viscous material applied to the donor substrate by the coating system). To ensure the uniform coating of the viscous material onto the donor substrate, the coating system used to coat the donor substrate may be a syringe and a gap system in which the viscous material is dispensed from a syringe (or other applicator) to the donor substrate which then passes through a well-defined gap (e.g., formed by blade of other kind of barrier, or a pair of rollers or cylinders). After passing through the gap, a uniform layer of the viscous material is present on the donor substrate and the laser assisted deposition/laser dispensing system can be used to jet dots of material from the coated, donor substrate to the receiving substrate. After providing the uniform layer of viscous material for printing, the donor substrate can be returned to the coating system (e.g., by linear translation in a reverse direction from that which it travelled to the printing area) for collection (or aggregation) of the residual material on the donor substrate and recoating thereof by the coating system to create a new uniform coated layer on the donor substrate for the next printing. As indicated above, the donor substrate may be a transparent film or other substrate, with or without a metal (or other) coating.

Systems configured in accordance with embodiments of the present invention may be used for printing a wide variety of liquid and/or paste materials. However, the present invention provides particular benefits for the printing of highly viscous materials that cannot be printed well in high resolution by other methods. For example, systems configured in accordance with embodiments of the present invention find particular application in printing solder pastes and other metal pastes, as well as high viscosity polymers, like acrylics, epoxies, and urethane-based adhesives, pastes or waxes. The present invention may also be employed in connection with the printing of temperature or oxygen sensitive materials since a coated, donor substrate can be maintained in a controlled environment prior to the printing process so as to avoid solvent evaporation or oxidation of the material to be printed.

The printing process, in which the viscous material is transferred from the donor substrate to the receiving substrate may make use of a laser-based system. For example, a printing head in the form of a laser (e.g., high frequency laser) may be used to selectively transfer dots or other segments of viscous material from the donor substrate to the receiving substrate. The laser (e.g., high frequency laser) may be arranged to scan the donor substrate in two dimensions so as to jet the dots or other segments of viscous material from the donor substrate to the receiving substrate. After being printed to the receiving substrate, the viscous material disposed on the receiving substrate may be cured by UV or infra-red light or dried by a heater, or may be subsequently transferred from the receiving substrate to another substrate by a further printing process.

These and further embodiments of the invention are described in detail below.

BRIEF DESCRIPTION OF THE DRAWINGS

The present invention is illustrated by way of example, and not limitation, in the figures of the accompanying drawings, in which:

FIGS. 13A and 13B depict a top view of a portion of the coating system showing the residual material on the donor substrate before being aggregated by a (stationary) squeegee (FIG. 13A) and the residual material after being aggregated by the squeegee into a blob (FIG. 13B), in accordance with one embodiment of the invention.

FIG. 15A (side view) and FIG. 15B (top view) depict a squeegee being positioned within a widened gap between the coating rollers for collecting the residual material, in accordance with one embodiment of the invention.

DETAILED DESCRIPTION OF THE INVENTION

Figure 1:
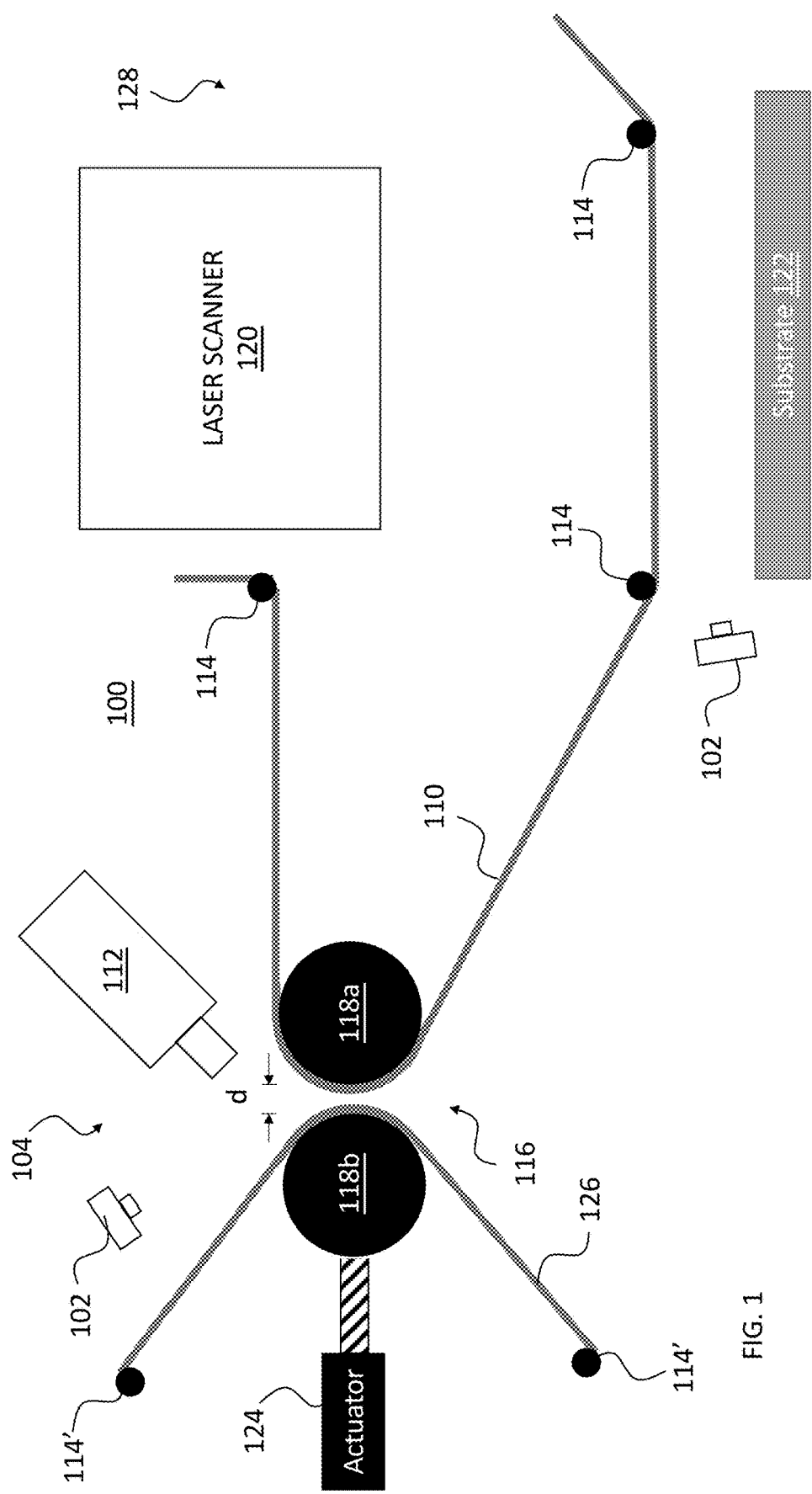
FIG. 1 depicts a side view of a printing system with a coating system and a printing unit, in accordance with one embodiment of the invention.

FIGS. 1-12 illustrate schematically aspects of a system 100 configured in accordance with the overview provided above. In system 100, the viscous material jetting process is segregated from the viscous material application process, thereby avoiding issues that can be experienced in conventional printing processes. System 100 also includes one or more imaging arrangements 102 for monitoring and control of the jetting and application processes.

In system 100, a coating system 104 creates a uniform layer 106 of the to-be-printed material 108 (e.g., a highly viscous material such as a solder paste or other metal paste(s), a ceramic paste, a wax material, a polymer material, a mixture of a polymer and a monomer material, or a low viscosity material) on a donor substrate 110. In the illustrated example, the coating system 104 includes a syringe (or other applicator) 112 of the to-be-printed material and an air or mechanical pump (not shown) that drives the material, under the control of a controller (not shown), onto the donor substrate 110. The donor substrate 110 is then moved, using rollers 114, which may be driven under the control of the controller by motors (not shown), toward a well-defined gap 116 between coating rollers 118a, 118b or knives (not shown) to create the uniform layer 106 of the to-be-printed material with a thickness that is defined by the gap 116. As will be apparent, the donor substrate 110 can be translated bidirectionally in a controlled manner, while widening the gap 116 between the coating rollers 118a, 118b, allowing for recoating of the donor substrate 110 with reclaimed residual portions of the material that are not consumed during a printing process without contamination to the rollers 118a, 118b. This not only reduces the amount of donor substrate 110 consumed during the printing process, but also prevents waste of the to-be-printed material as any residual material from a printing process can be used in subsequent iterations of that process.

Although not shown in detail in these figures, the coating system 104 and, optionally, the laser-based scanning print system 120 may be housed inside a closed cell with a controlled environment (cold or hot) in order to prevent evaporation of solvent from the to-be-printed material or to prevent material oxidation, thereby prolonging the pot life of the material. In some embodiments of the invention, the coating system 104 contains more than one material, thereby allowing a plurality of materials to be printed onto the donor substrate 110 in a controlled sequence and making it possible to print more than one material on a receiving substrate 122.

Figure 2:
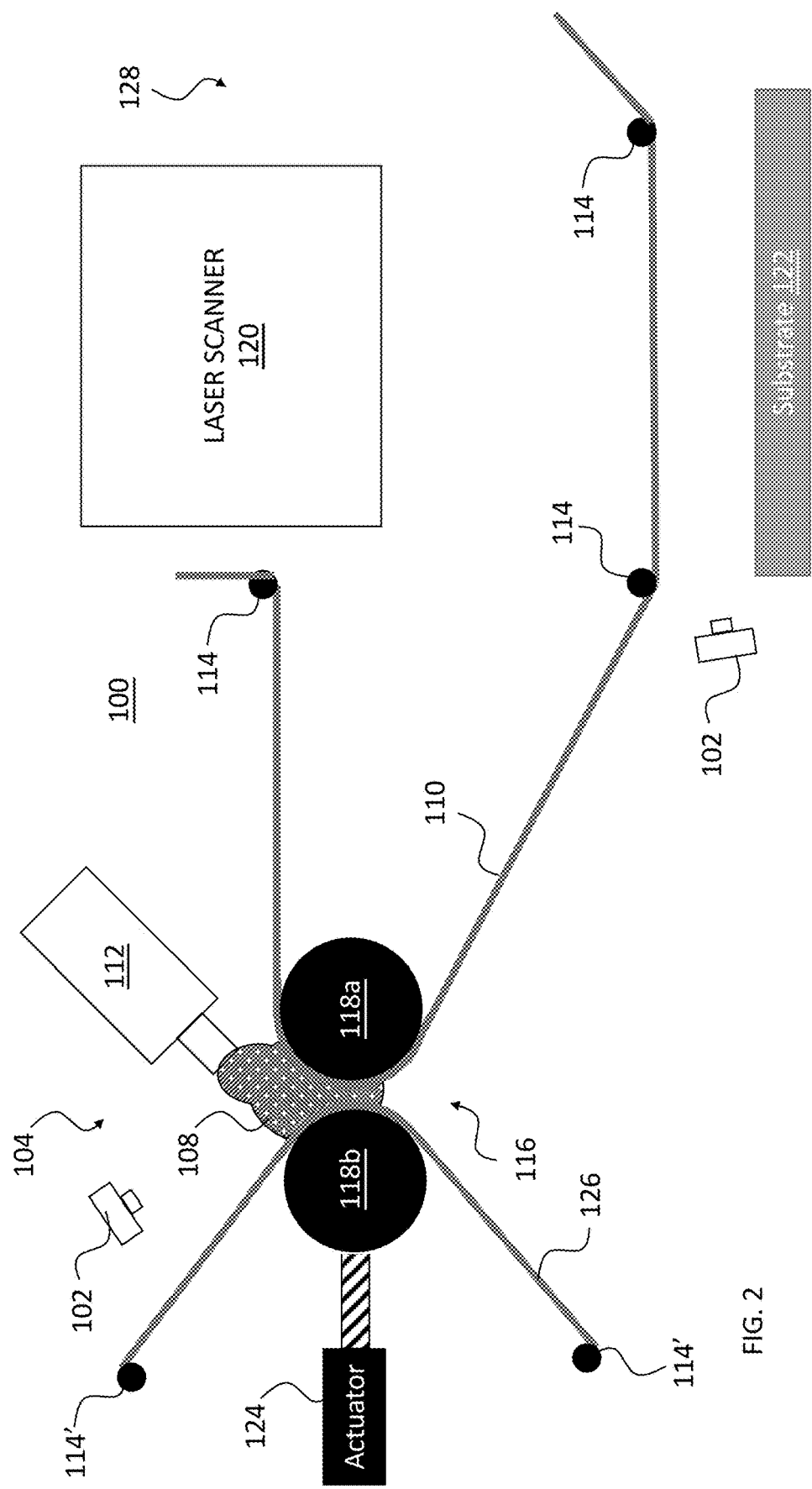
FIG. 2 depicts material (i.e., to-be-printed material) being dispensed from a syringe (or other applicator) into a vicinity of a gap between two coating rollers of the coating system, in accordance with one embodiment of the invention.
Figure 3:
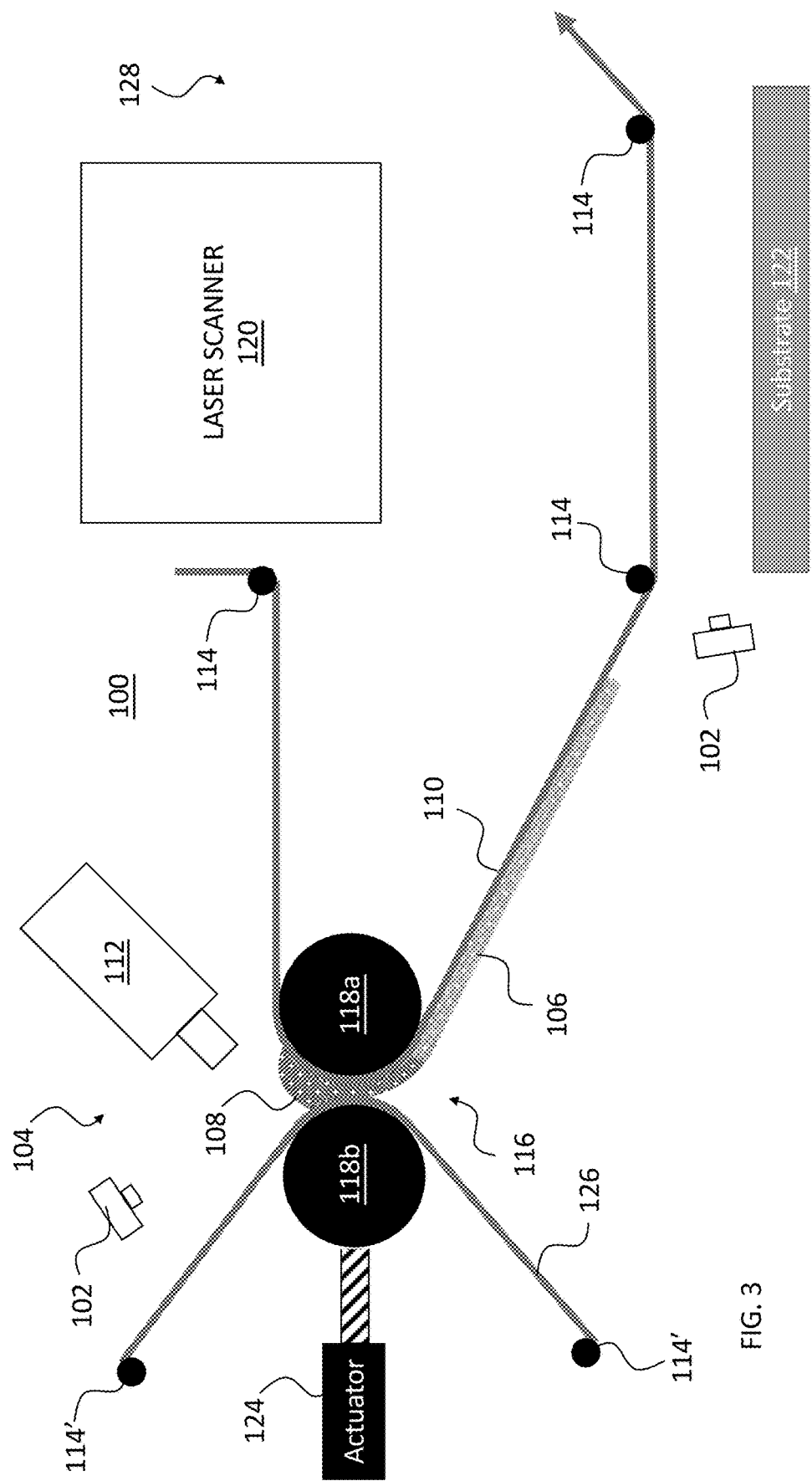
FIG. 3 depicts the dispensed material being passed through the gap by translation of the donor substrate, the passing of the dispensed material through the gap resulting in the formation of a uniform layer of the to-be-printed material on the donor substrate, in accordance with one embodiment of the invention.

FIGS. 1-3 highlight the creation of a uniform layer 106 of the to-be-printed material 108 on the donor substrate 110. In FIG. 1, printing system 100 is arranged so that the coating rollers 118a, 118b of coating system 104 are spaced apart from one another so as to create a well-defined gap 116 between them. The distance "d" between facing planes of the rollers, that is, the width of gap 116, may be set using actuator 124. In one embodiment, actuator 124 may use piezoelectric translators that include a piezoelectric ceramic that expands in a defined direction upon application of an electric current (e.g., under the control of a controller). The ceramic is orientated so that when it expands (at the application of a current under the control of the controller), coating roller 118b is displaced along one or more axes, towards or away from coating roller 118a, thereby narrowing or widening gap 116. Generally, a number of piezoelectric translators may be used to move the coating roller 118b and the various piezoelectric translators may be energized at the same time (or nearly so) so that their actions are coordinated with one another. Thus, the piezoelectric translators may be arranged so that they impart motion to the coating roller 118b in the same direction and the translation distance may be proportional to the magnitude of the current applied to the piezo translators. In some embodiments, the translation distance of the coating roller 118b for each activation of the piezoelectric translators may be on the order of a few tens of nanometers to a few microns or more.

Alternatively, actuator 124 may be configured to drive a lead screw to translate coating roller 118b towards or away from coating roller 118a. Additionally, although only a single actuator 124 is shown, in some embodiments a second actuator may be associated with coating roller 118a and the respective positions of the two coating rollers may be adjustable independently or collectively with respect to one another using individual actuators. As shown in the illustrated example, coating roller 118b may carry a film or other substrate 126 to aid in creating the uniform layer 106 of material on donor substrate 110. Accordingly, the substrate 126 may be tensioned so as to eliminate any slack when the coating roller 118b is translated towards or away from coating roller 118a.

FIG. 2 illustrates the initial dispensing of an amount of the to-be-printed material 108 by coating system 104. The to-be-printed material 108 is dispensed from syringe 112 onto the donor substrate 110 in the vicinity of the gap 116 between coating rollers 118a, 118b. The amount and location of this dispensing may be monitored by one or more imaging arrangements 102 and the dispensing site may be varied by altering the position and orientation of the syringe 112 using appropriate control means.

As the to-be-printed material 108 is dispensed, or upon completion of an initial dispensing thereof, the donor substrate 110 is advanced so as to cause the to-be-printed material 108 thereon to be passed through the gap 116 between coating rollers 118a, 118b. As shown in FIG. 3, this causes the to-be-printed material 108 to be drawn over a length of the donor substrate 110 in a uniform (or nearly so) layer 106 with a thickness equal to (or nearly so) the width of gap 116.

Figure 4:
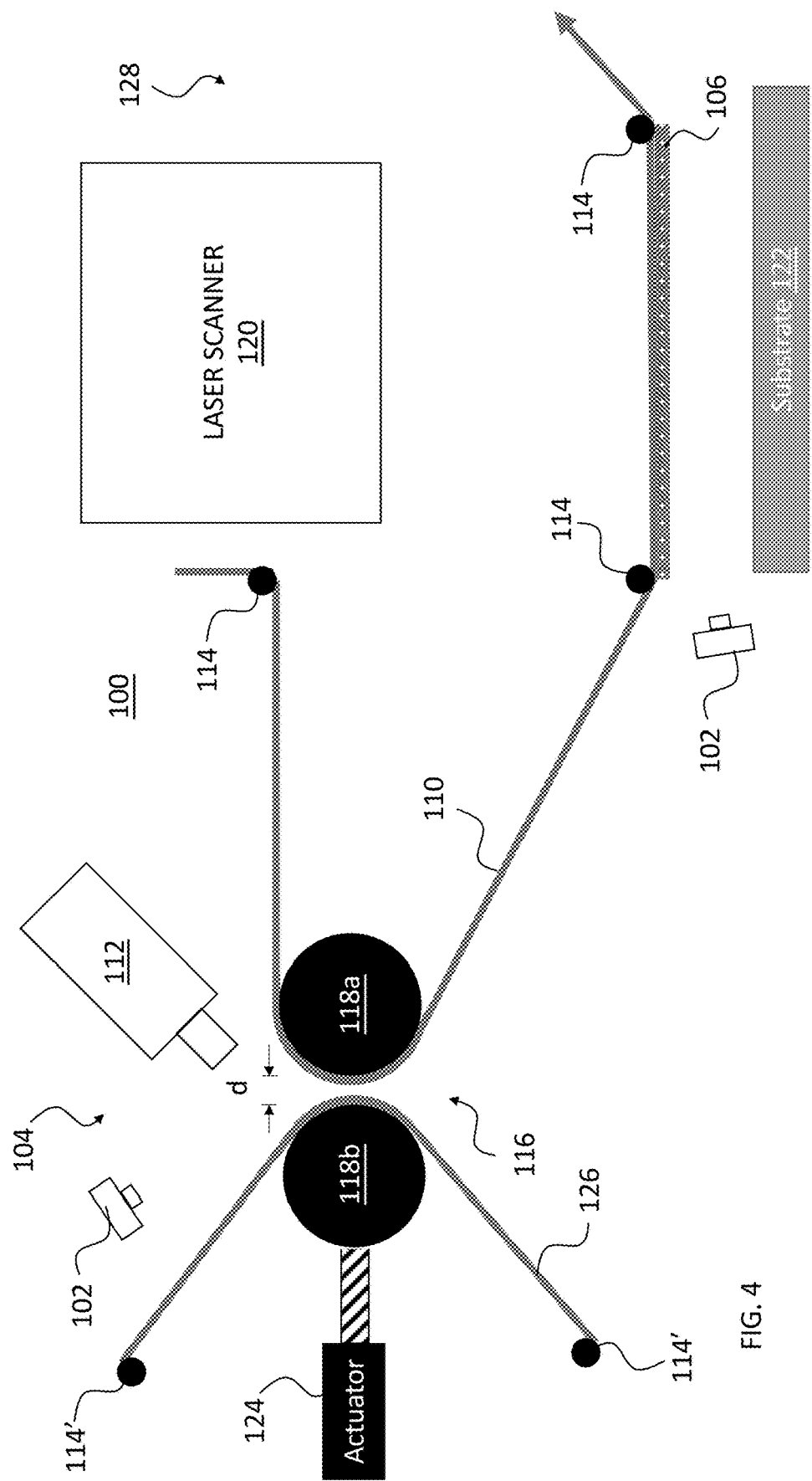
FIG. 4 depicts the donor substrate with a uniform layer of the to-be-printed material within the printing unit, in accordance with one embodiment of the invention.
Figure 5:
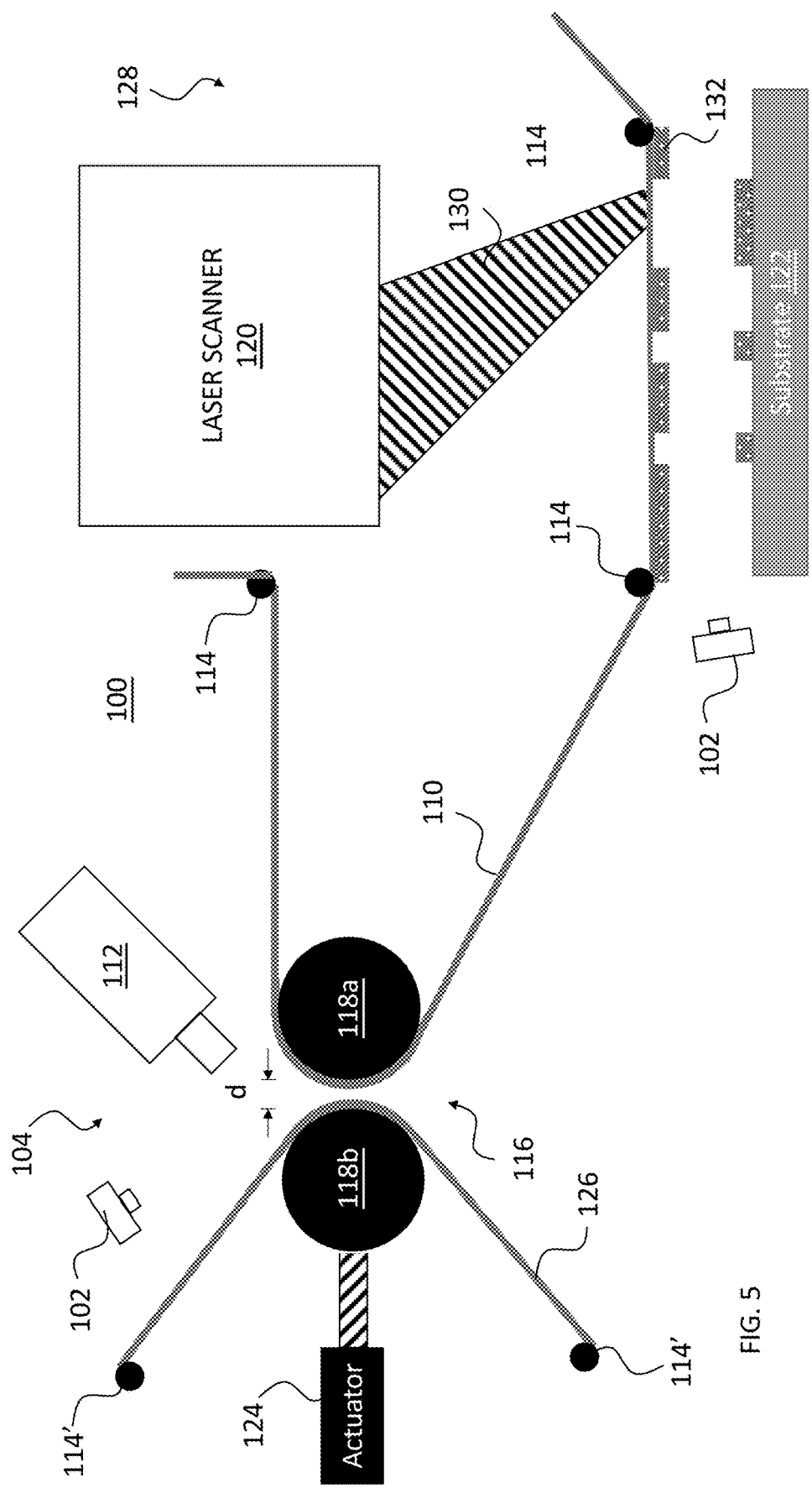
FIG. 5 depicts the jetting of portions of the material from the donor substrate onto the receiving substrate by scanning a laser (e.g., a high frequency laser) over the donor substrate, in accordance with one embodiment of the invention.

In FIG. 4, the uniform layer 106 of to-be-printed material on donor substrate 110 has reached a printing position with respect to printing unit 128. The donor substrate 110 may be a transparent film, that is, a film that is transparent at the wavelength(s) of the laser used for the printing process, and the printing unit 128 includes a laser scanner 120 that contains a laser (e.g., a high frequency laser) arranged to jet portions of the layer of coated material 108 from the donor substrate 110 to receiving substrate 122 by focusing a laser beam 130 onto the interface between the layer of material 108 and the donor substrate 110, as shown in FIG. 5. The incident laser beam 130 causes local heating followed by a phase change and high local pressure which drives jetting of the material 108 from the donor substrate 110 onto the receiving substrate 122. The printing process may be monitored using one or more imaging arrangements 102 and the laser controlled accordingly.

Figure 6:
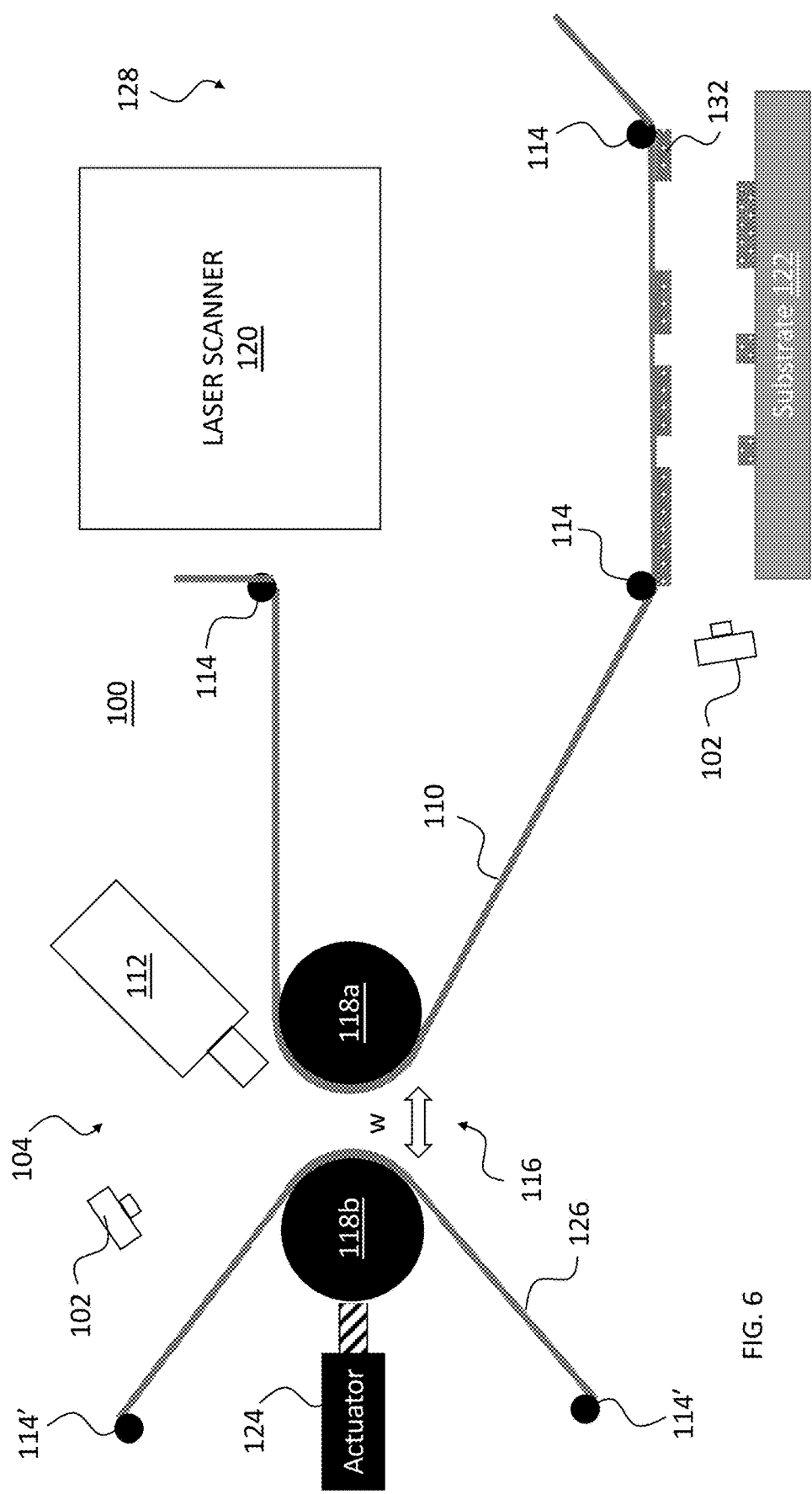
FIG. 6 depicts the widening of the gap between the coating rollers, in preparation for a recoating process, in accordance with one embodiment of the invention.
Figure 7:
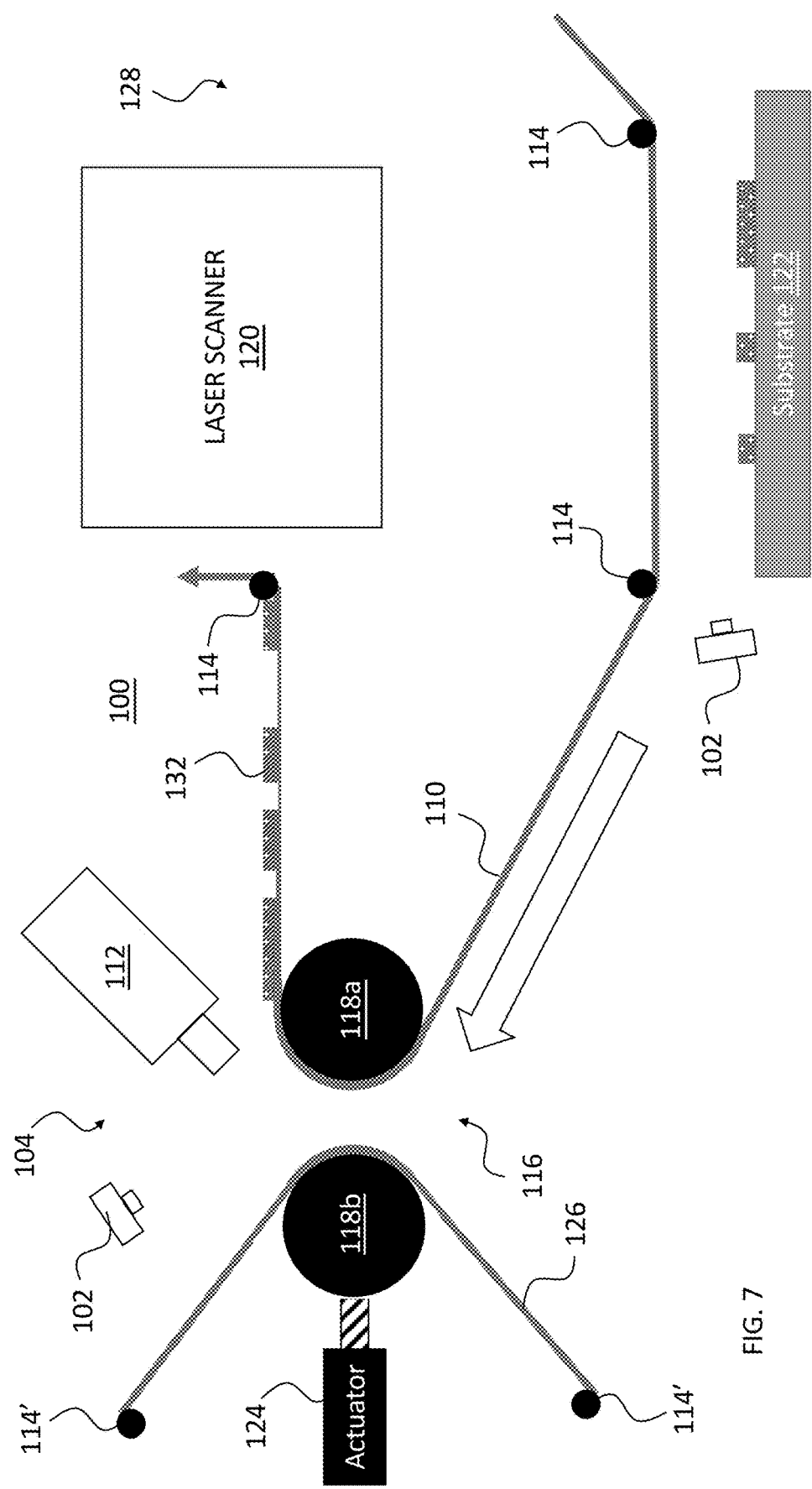
FIG. 7 depicts the translation of residual portions of the material on the donor substrate away from the printing unit, and towards and through the gap of the coating system, in accordance with one embodiment of the invention.

After such printing, a residual amount 132 of material 108 will remain on the donor substrate 110. In accordance with embodiments of the present invention, this residual material 132 may be returned to the coating system 104 for reuse. As shown in FIG. 6, following the printing, the laser scanner 120 is switched off, and the gap 116 between coating rollers 118a, 118b is increased from its original width "d" to a wider width "w". Width w may be a multiple of d, but in any event is sufficiently wide enough so as to allow the donor substrate 110 to pass between coating rollers 118a, 118b without contaminating the rollers with any of the residual portions of material 108 present thereon. That is, as shown in FIG. 7, the donor substrate 110 is translated by rollers 114 in the reverse direction from that which it traveled from coating system 104 to printing unit 128 so that the residual material 132 is located upstream (from the perspective of the original direction of travel of donor substrate 110) of the gap 116 between coating rollers 118a, 118b.

Figure 8:
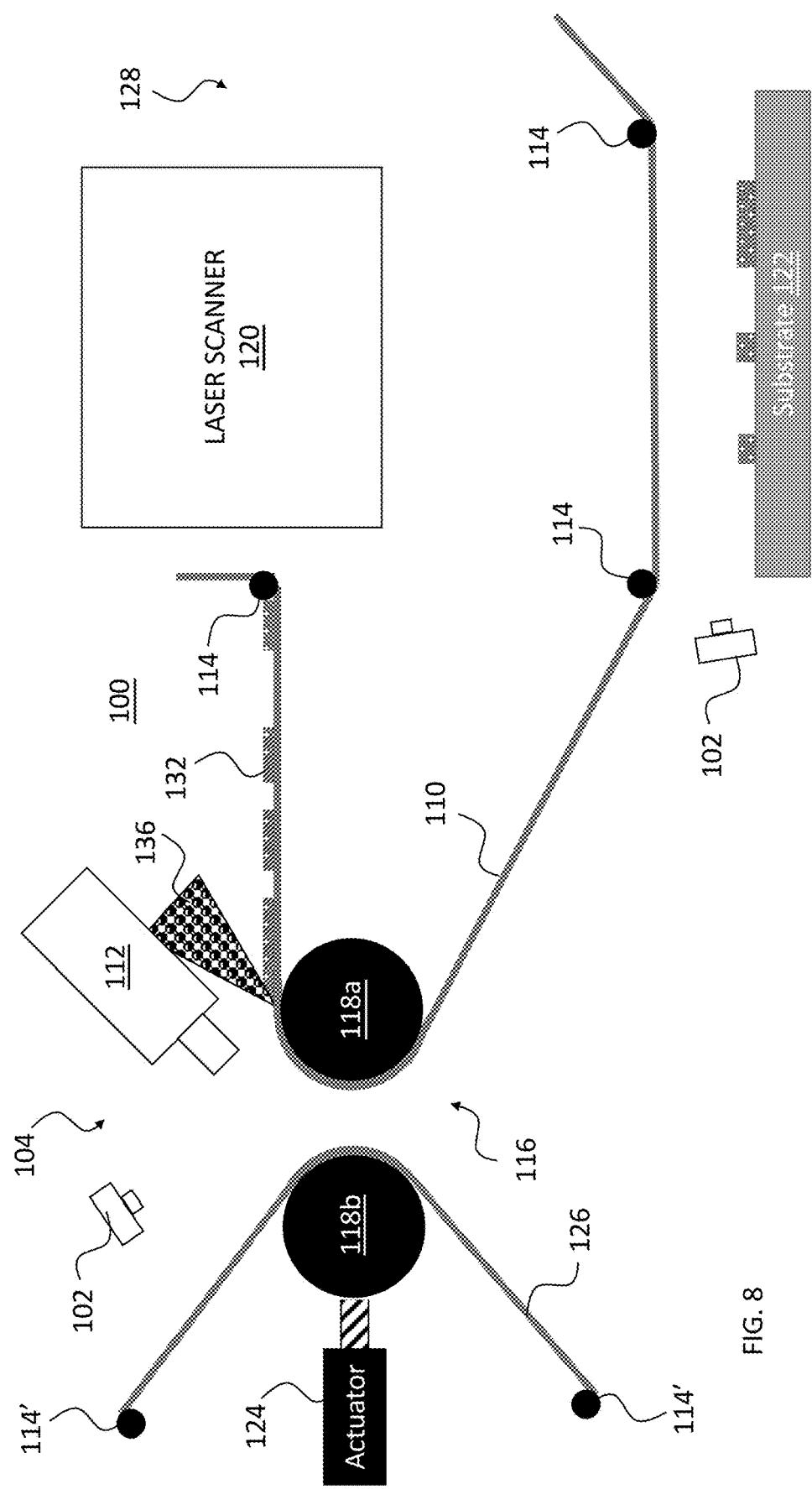
FIG. 8 depicts the positioning of a squeegee on the surface of the donor substrate, near and upstream of the gap between the coating rollers, in accordance with one embodiment of the invention.
Figure 9:
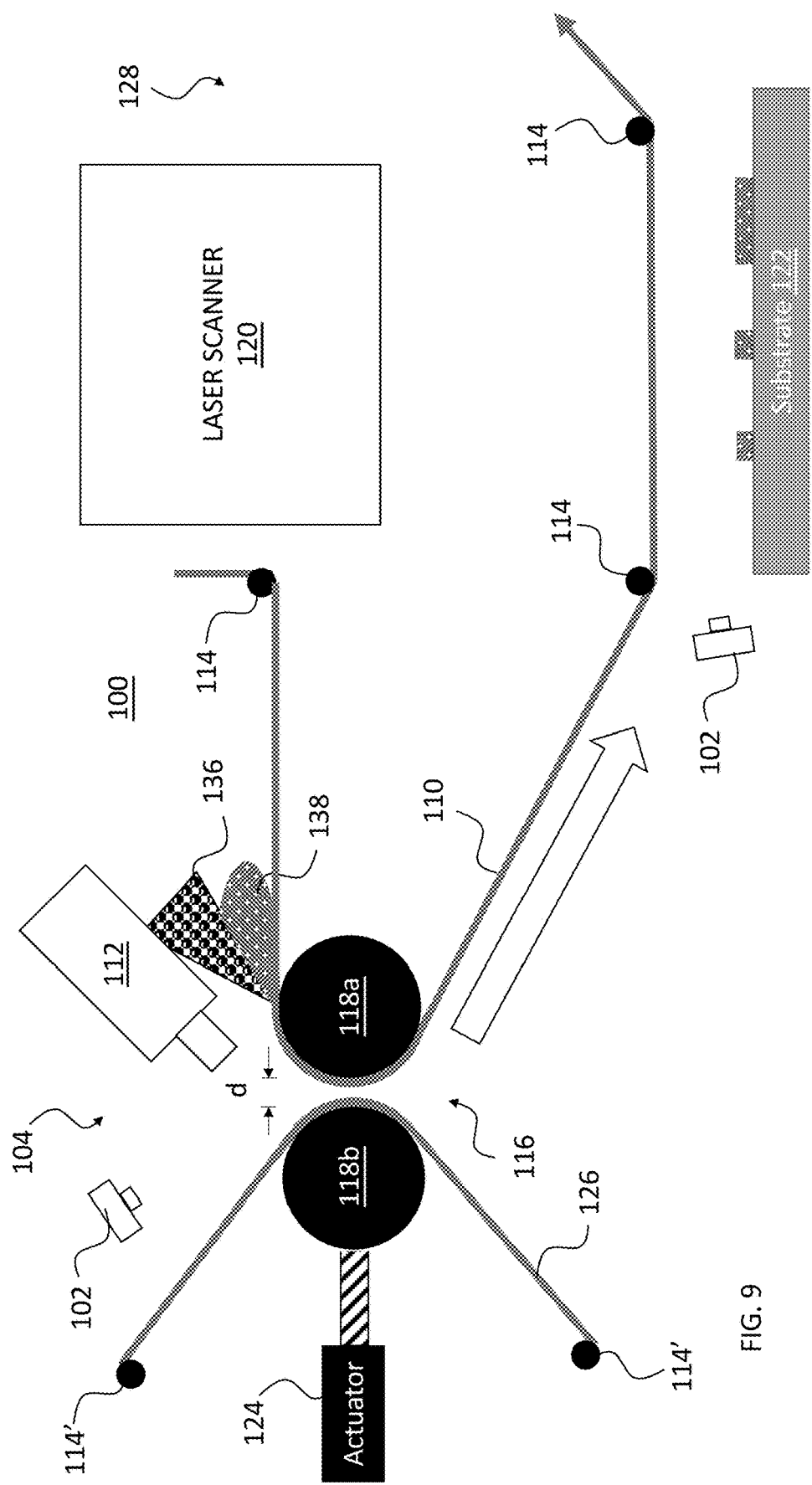
FIG. 9 depicts the gap between coating rollers being returned to its original width, the donor substrate being advanced in its original direction of travel towards the printing unit, and the collection (or aggregation) of the residual portions of material into a blob at the interface between the squeegee and the donor substrate, in accordance with one embodiment of the invention.
Figure 10:
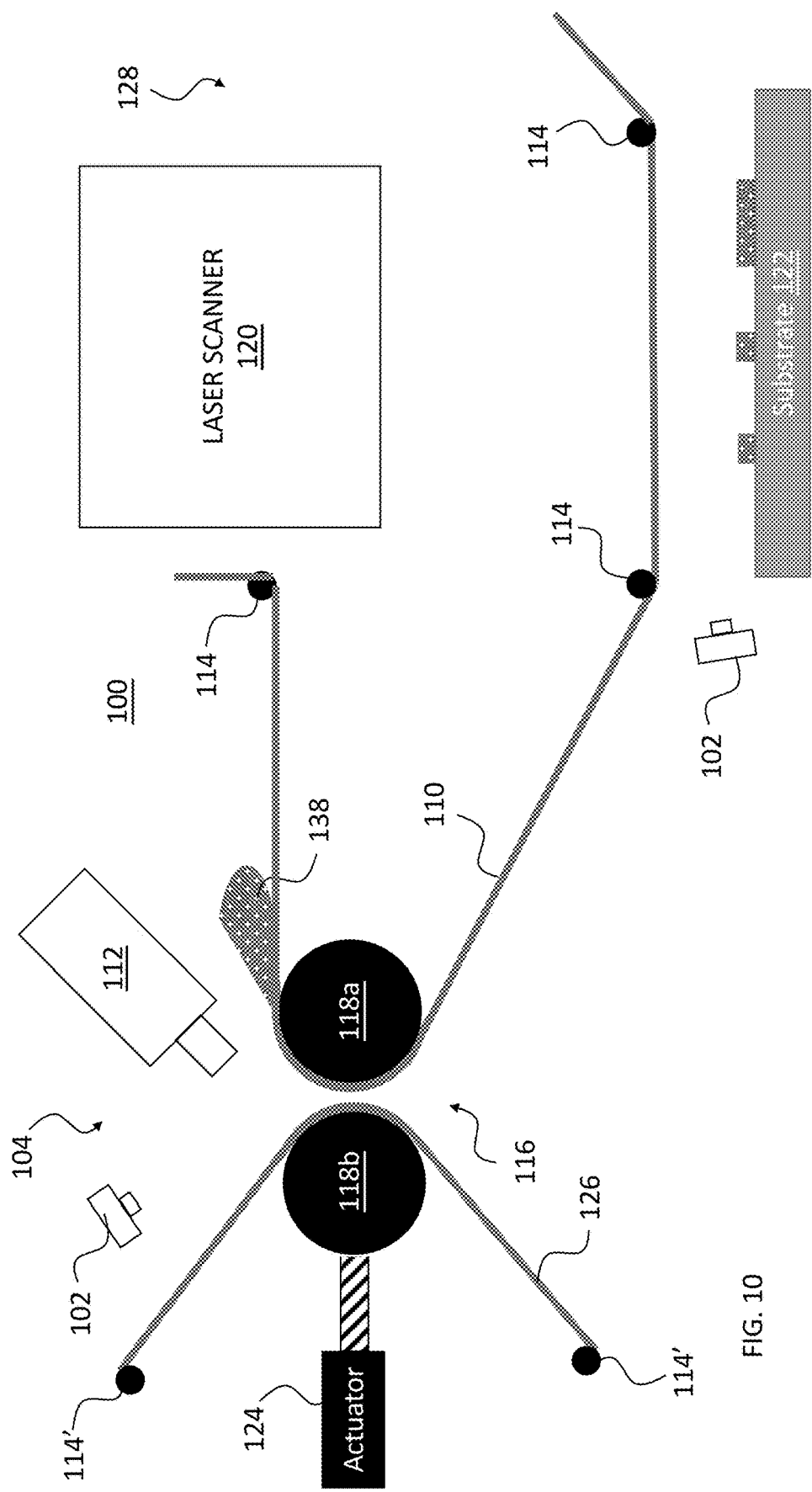
FIG. 10 depicts the blob of aggregated material disposed on the donor substrate after the squeegee has been removed, in accordance with one embodiment of the invention.

By returning the residual material 132 on donor substrate 110 to the coating system 104, the residual material 132 can be reused. As shown in FIG. 8, with the rollers 118a, 118b still spaced apart, a squeegee 136 may be positioned on the surface of the donor substrate 110, near but upstream of the gap 116. Then, as shown in FIG. 9, the gap 116 between coating rollers 118a, 118b may be returned to its original width, "d" and the donor substrate 110 advanced in its original direction of travel. This causes the residual material 132 on donor substrate 110 to be collected (or aggregated) into a blob 138 at the interface between the squeegee 136 and the donor substrate 110. Once the residual material 132 has been so collected (or aggregated), then, as shown in FIG. 10, the squeegee 136 may be removed. Note, some of the sequence of events may be modified from that shown in the illustrations. For example, the gap 116 between coating rollers 118a, 118b may be returned to its original dimension "d" prior to, simultaneous with, or following the advancing of the donor substrate 110. Also, the advancing of the donor substrate 110 may result in a very thin layer of material 108 being formed on the donor substrate 110 as the residual portions thereof are collected into the blob 138.

This very thin layer of material may or may not be removed, for example, through subsequent collection in the fashion discussed above.

Figure 11:
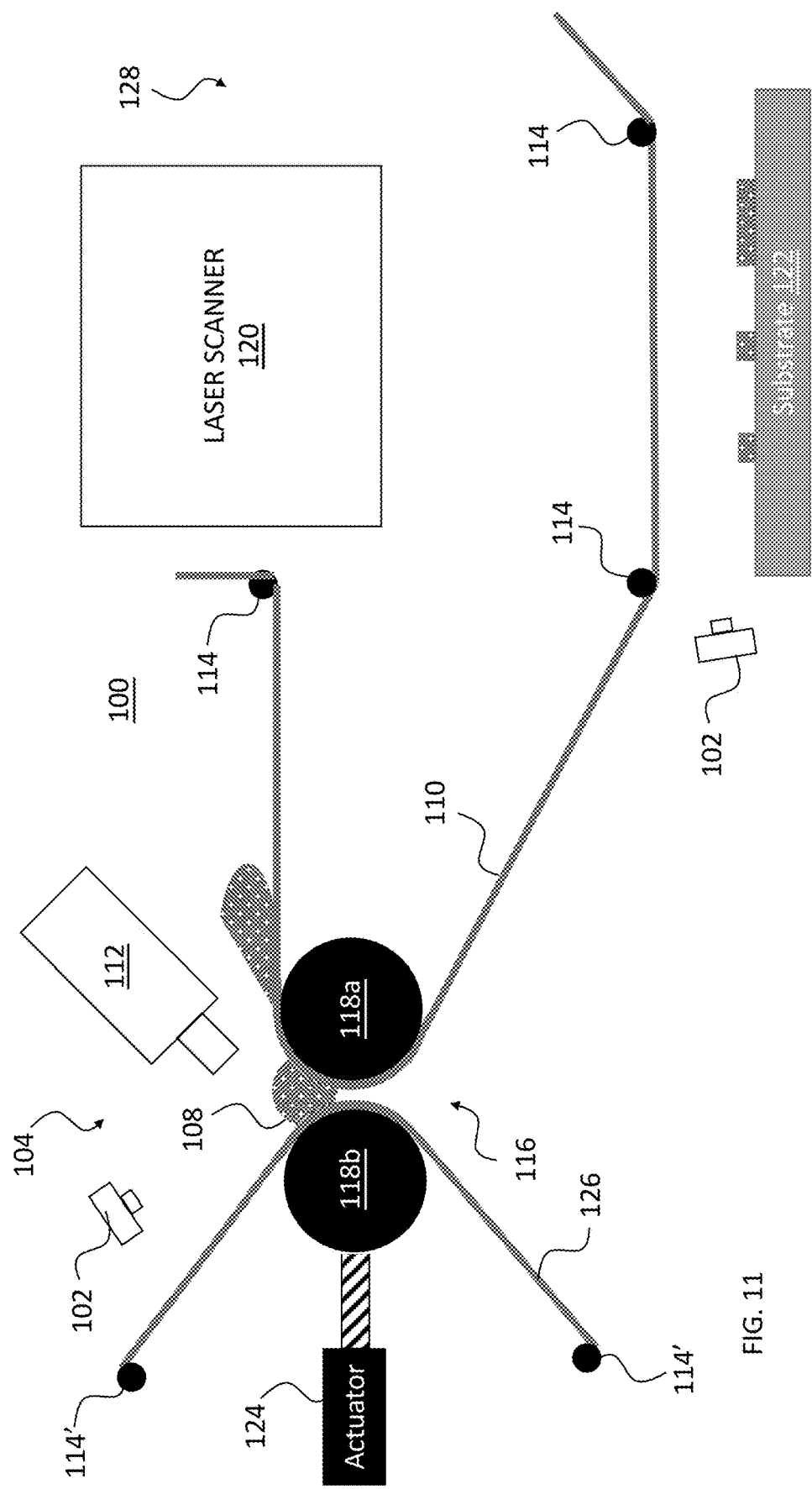
FIG. 11 depicts additional material (i.e., to-be-printed material) being dispensed from a syringe into a vicinity of the gap between the coating rollers, in accordance with one embodiment of the invention.
Figure 12:
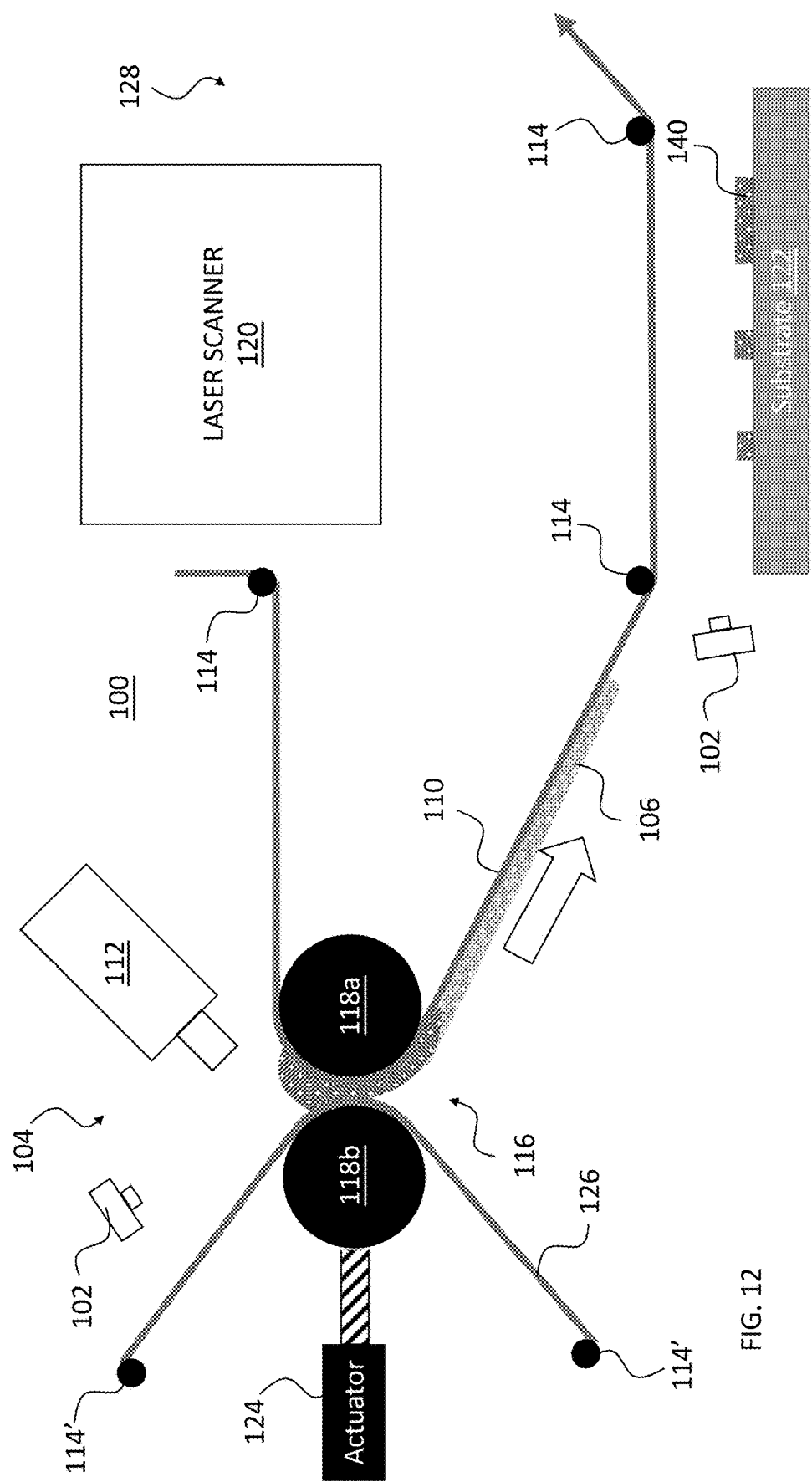
FIG. 12 depicts the donor substrate being advanced towards the printing unit so as to pass the collected residual material through the gap between the coating rollers, and form a new uniform layer of the to-be-printed material on the donor substrate, in accordance with one embodiment of the invention.

Depending on the amount of residual material 132 recovered into blob 138, additional amounts of material 108 may be needed for a subsequent printing operation. As shown in FIG. 11, additional amounts of material 108 may be dispensed using syringe 112 onto donor substrate 110 in the vicinity of gap 116. Then, as shown in FIG. 12, the printing process may be commenced again, with the collected (or aggregated) residual material and any additional material being formed into a uniform (or nearly so) layer 106 of material on donor substrate 110 by advancing the donor substrate 110 towards the printing unit 128. As the material passes through gap 116, it is formed into the uniform layer 106. The printing and recovery process may be repeated as desired in order to form one or more layers of material 140 on receiving substrate 122.

FIGS. 13A and 13B depict a top view of a squeegee 136 in the collection of residual material 132 on a donor substrate 110. FIG. 13A shows the situation before the collection of the residual material 132 into a blob 138, with portions of residual material 132 disposed on donor substrate 110 upstream of the squeegee 136. As the donor substrate 110 is advanced in its original direction of travel towards the gap (not shown in this view), the residual material 132 is collected into blob 138 by squeegee 136. FIG. 13B shows the situation after collection of the residual material 132 into the blob 138. To aid in this process and to keep the collected residual material on the donor substrate 110, the squeegee 136 may be shaped in the form of a chevron or other convenient shape (e.g., a crescent).

In some embodiments, rather than a squeegee 136, a separate film may be used to aid in the collection of the residual material 132. For example, a film carried by one or more rollers may be moved into position atop the donor substrate 110 and the donor substrate 110 advanced towards the interface with the film. The residual material 132 will collect upstream of that interface and thereby be available for use.

In other embodiments, the squeegee 136 may be positioned so as to collect residual material 132 on the donor substrate 110 as the donor substrate 110 is returned to the coating system 104. That is, the squeegee 136 may be positioned upstream of the gap 116 (with the stream direction referring to the original direction and not the reverse direction) so that the residual material 132 is collected into a blob as the donor substrate 101 travels in its reverse direction, thereby avoiding the need to separately position the squeegee 136 and have the donor substrate 110 travel in its original direction for collection of the residual material. This will result in the residual material being collected further upstream from the gap 116 than is the case according to the above-described method, however, in some cases it may be preferable or at least permissible to do so.

Figure 14A:
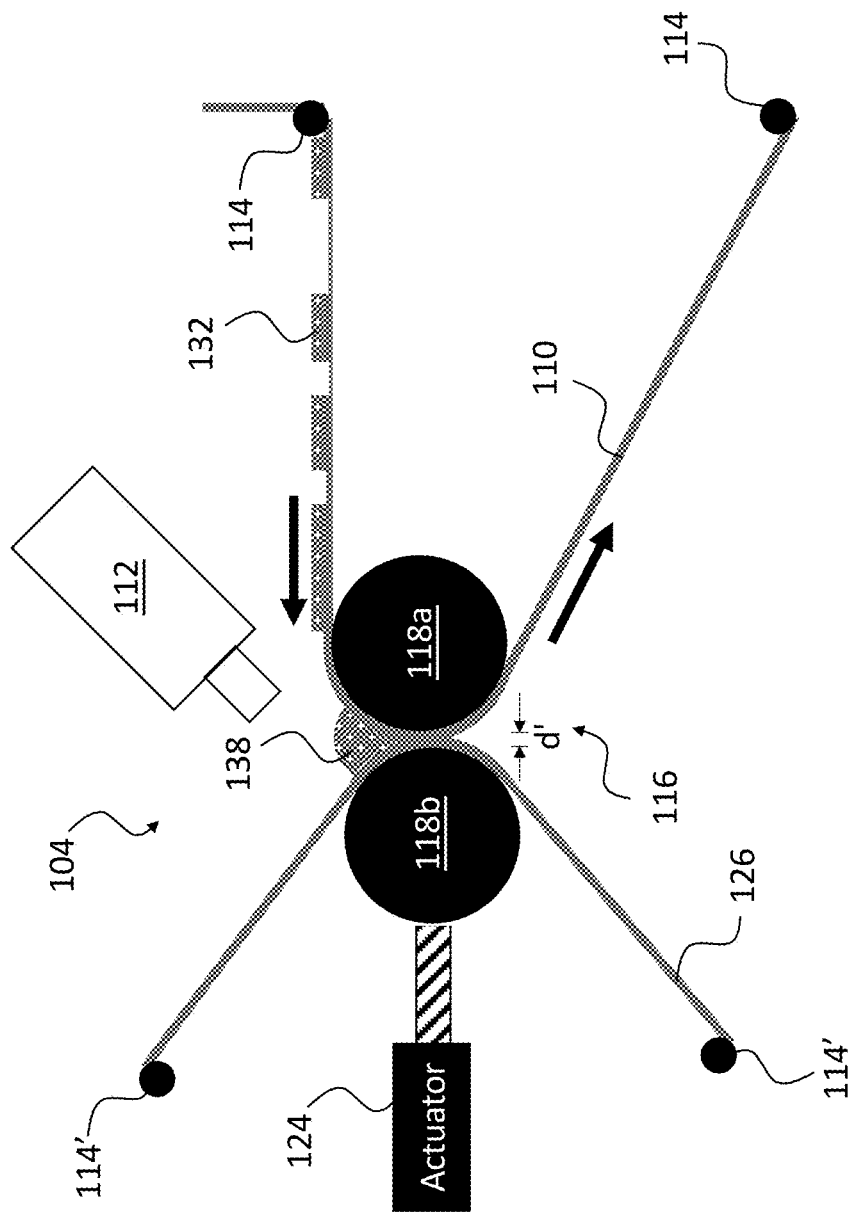
FIG. 14A depicts the residual portions of the material being collected (or aggregated) by translating the donor substrate through a narrowed gap between the coating rollers, in accordance with one embodiment of the invention.

FIG. 14A shows yet a further embodiment where the gap 116 is used as a collection element for residual material 132. In this case, with the residual material 132 located upstream of the gap 116 between coating rollers 118a, 118b, the gap 116 is compressed to a width d', for example, by extending actuator 124 so that the film 126 touches the donor substrate 110. Now, when donor substrate 110 is advanced in its original direction, the residual material 132 will collect in (or aggregate into) a blob 138 adjacent the area where the film 126 and donor substrate 110 meet, just prior to the now very narrow gap 116 between coating rollers 118a, 118b. Because the gap 116 is so narrow, only a very small amount of the material 108 will pass through the gap 116 (in the form of a very thin layer of material on the donor substrate 110), with the majority of the residual material 132 being collected for reuse. The gap 116 can then be widened back to its original width, "d," and the donor substrate 110 recoated using the residual material in the fashion described above (see FIG. 12).

Figure 14B:
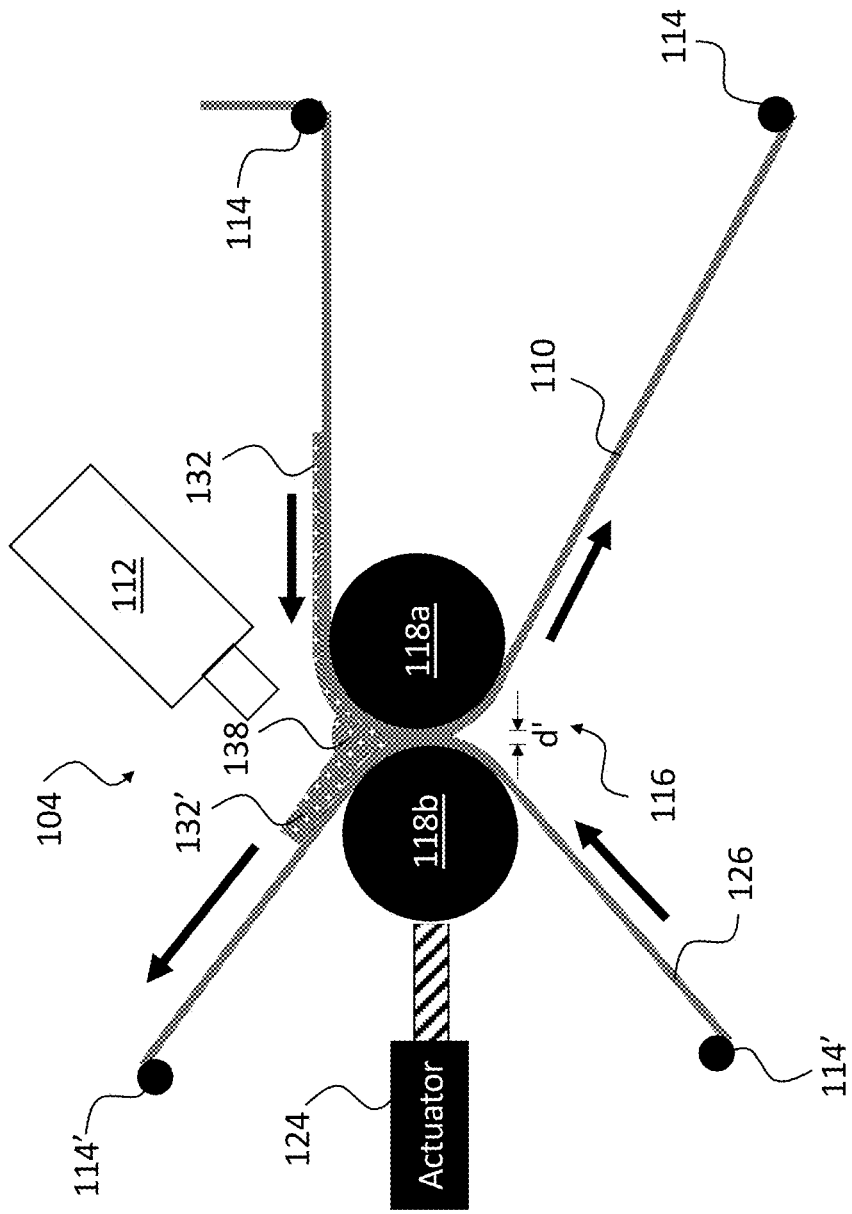
FIG. 14B depicts the residual portions of the material being collected (or aggregated) by translating the donor substrate through a narrowed gap between the coating rollers, and further translating a film in the opposite direction of the donor substrate through the gap in order to draw the collected material away from the gap, in accordance with one embodiment of the invention.

FIG. 14B shows a variation of the solution depicted in FIG. 14A. In this embodiment, the gap 116 is again used as a collection element for residual material, but this time the collected residual material is also taken up on film 126. Initially, the residual material 132 is located upstream of the gap 116 between coating rollers 118a, 118b. The gap 116 is compressed to a width d', for example, by extending actuator 124 so that the film 126 touches the donor substrate 110. Now, when donor substrate 110 is advanced in its original direction, the residual material 132 will collect in a blob 138 adjacent the area where the film 126 and donor substrate 110 meet, just prior to the now very narrow gap 116 between coating rollers 118a, 118b. As the donor substrate 110 is advanced, the film 126 is moved in the opposite direction (e.g., by rollers 114'), so that it draws portions of the residual material 132' away from the gap 116 on film 126. The speed ratio between the film 126 and the donor substrate 110 as well as the amount of residual material 132 will determine the distribution of the portions of the residual material 132' on film 126. After the portions of the residual material 132' have been collected on film 126, the gap 116 can then be widened back to its original width, "d," and the direction of motion of film 126 can be reversed so that it now moves to bring the collected portions of the residual material 132' towards the donor substrate 110 near the gap 116 and the donor substrate 110 can be recoated using the collected portions of the residual material 132', optionally along with additional material dispensed from syringe 112 in the fashion described above (see FIG. 11). The recoated donor substrate 110 can then be moved to the printing stage, as described above (see FIG. 12).

FIGS. 15A, a side view, and 15B, a top view, illustrate yet a further embodiment of the invention, this time with the squeegee 136 being positioned within a widened gap 116 between coating rollers 118a, 118b for collecting the residual material 132. In this example, the gap width between the coating rollers 118a, 118b is widened so as to accommodate squeegee 136, which is positioned between the two rollers 118a, 118b. Preferably, the squeegee 136 is shaped so as to allow collection of the residual material 132 without contaminating the rollers 118a, 118b, for example in a "U" or similar shape. Now when the donor substrate 110 advanced in its original direction of travel, the residual material 132 is collected by the squeegee 136 on donor substrate 110, allowing it to be reused as discussed above. Once the residual material 132 has been so collected (or aggregated), the squeegee 136 may be removed and the gap 116 between coating rollers 118a, 118b may be returned to its original dimension "d," allowing the collected residual material to be coated on the donor substrate 110 in a uniform layer 106. Note, in this case it may be necessary to first rewind the donor substrate 110 so that the collected residual material is moved out of the area of the gap 116 (e.g., is drawn out of a cavity of the squeegee 136) before the squeegee 136 is removed.

Thus, systems and methods for collecting residual material that remains on a donor substrate after laser-assisted deposition of the material from the donor substrate to a receiving substrate, allowing for immediate reuse of the collected residual material have been described. Although not illustrated in detail, it should be appreciated that the various components of the systems described herein operate under the control of one or more controllers, which, preferably, are processor-based controllers that operate under the instruction of machine-executable instructions stored on tangible machine-readable media. Such controllers may include a microprocessor and memory communicatively coupled to one another by a bus or other communication mechanism for communicating information. The memory may include a program store memory, such as a read only memory (ROM) or other static storage device, as well as a dynamic memory, such as a random-access memory (RAM) or other dynamic storage device, and each may be coupled to the bus for providing and storing information and instructions to be executed by the microprocessor. The dynamic memory also may be used for storing temporary variables or other intermediate information during execution of instructions by the microprocessor. Alternatively, or in addition, a storage device, such as a solid state memory, magnetic disk, or optical disk may be provided and coupled to the bus for storing information and instructions. The controller may also include a display, for displaying information to a user, as well as various input devices, including an alphanumeric keyboard and a cursor control device such as a mouse and/or trackpad, as part of a user interface for the printing system. Further, one or more communication interfaces may be included to provide two-way data communication to and from the printing system. For example, network interfaces that include wired and/or wireless modems may be used to provide such communications.

LIST OF REFERENCE NUMERALS

100 Printing system
102 Imaging arrangements
104 Coating system
106 Uniform layer
108 Material, to-be-printed material
110 Donor substrate
112 Syringe
114 Rollers
114' Rollers
116 Gap
118a,b Coating roller
120 Laser scanner
122 Receiving substrate
124 Actuator
126 Film or other substrate
128 Printing unit
130 Laser beam
132 Residual material
132' Collected or aggregated residual material
136 Squeegee
138 Blob
140 One or more layers of material
d Gap width
d' Narrowed gap width
w Widened gap width

What is claimed is:
1. A method, comprising:
creating a uniform layer of a material on a donor substrate using a coating system which includes a syringe of the material, wherein the uniform layer of the material is created by:
dispensing the material from the syringe onto the donor substrate; and
transporting the donor substrate with the material thereon towards and through a gap with a first gap width defined by a first coating roller and a second coating roller, the uniform layer of the material having a thickness that is defined by the first gap width;
printing portions of the material from the donor substrate to a receiving substrate by a printing unit; and
recapturing residual portions of the material on the donor substrate for reuse by returning the donor substrate having the residual portions of the material to the coating system and aggregating the residual portions of the material on the donor substrate at the coating system,
wherein the residual portions of the material are aggregated by (i) modifying the gap to have a second gap width that is narrower than the first gap width, and (ii) using a film at least partially disposed within the gap to aggregate the residual portions of the material on the donor substrate while the residual portions of the material are translated towards an interface between the film and the donor substrate, the interface disposed within the gap.

2. The method of claim 1, wherein the material comprises one of a solder paste, a metal paste, a ceramic paste, a viscous material, a wax material, a polymer material, a mixture of the polymer and a monomer material, a low viscosity material, an ultraviolet (UV)-curable material, a heat-curable material, or a dryable material.

3. The method of claim 1, wherein the printing unit comprises a laser-based system that includes a laser and the portions of the material are printed from the donor substrate to the receiving substrate by jetting the portions of material from the donor substrate to the receiving substrate using the laser.

4. The method of claim 1, wherein the donor substrate is a film substrate and the method further comprises transporting by one or more rollers the donor substrate from the coating system to the printing unit.

5. The method of claim 1, wherein returning the donor substrate having the residual portions of the material to the coating system comprises:
- modifying the gap to have a third gap width that is wider than the first gap width; and
- translating the donor substrate with the residual portions of the material through the gap having the third gap width.

* * * * *